(12) United States Patent
Yang et al.

(10) Patent No.: US 11,237,205 B2
(45) Date of Patent: Feb. 1, 2022

(54) TEST ARRAY STRUCTURE, WAFER STRUCTURE AND WAFER TESTING METHOD

(71) Applicant: NANYA TECHNOLOGY CORPORATION, New Taipei (TW)

(72) Inventors: Tsang-Po Yang, New Taipei (TW); Jui-Hsiu Jao, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 78 days.

(21) Appl. No.: 16/868,520

(22) Filed: May 6, 2020

(65) Prior Publication Data
US 2021/0349145 A1 Nov. 11, 2021

(51) Int. Cl.
*G01R 31/28* (2006.01)

(52) U.S. Cl.
CPC .................. *G01R 31/2851* (2013.01)

(58) Field of Classification Search
CPC ...... G01R 31/28; G01R 31/2831; G11C 5/00; G11C 5/06; G11C 5/063; G11C 5/025; G11C 11/1655; G11C 11/1657; G11C 11/2255; G11C 11/2257
See application file for complete search history.

(56) References Cited

U.S. PATENT DOCUMENTS

| 2006/0071259 A1* | 4/2006 | Verhoeven ........ H01L 21/76895 257/299 |
| 2006/0118846 A1* | 6/2006 | Bissey .............. H01L 27/10891 257/296 |
| 2008/0225615 A1* | 9/2008 | Carpenter ...... G01R 31/318511 365/201 |
| 2009/0027065 A1* | 1/2009 | Kuang ................... G11C 29/50 324/617 |

* cited by examiner

*Primary Examiner* — Son T Le
(74) *Attorney, Agent, or Firm* — CKC & Partners Co., LLC

(57) ABSTRACT

A test array structure includes a substrate, first and second cells, first and second bit-line rings and four word-lines. Each of the first and second cells has a first drain region, a first gate region, a source region, a second gate region and a second drain region connected together in sequence. The first drain region and the first gate region of the first cell are located within the first bit-line ring. The second drain region and the second gate region of the first cell are located between the first and second bit-line rings. The first drain region and the first gate region of the second cell is located within the second bit-line ring. The second drain region of the first cell and the first drain region of the second cell are located between the two immediately-adjacent word-lines.

11 Claims, 12 Drawing Sheets

TEST ARRAY STRUCTURE, WAFER STRUCTURE AND WAFER TESTING METHOD

BACKGROUND

Technical Field

The present disclosure relates to a test array structure, a wafer structure with the test array structure and a wafer testing method.

Description of Related Art

For semiconductor device fabrication, it is an important problem to ensure qualities of a wafer. Therefore, kinds of electrical parameter tests can be executed for wafers. For a wafer to be tested, a test chip can be constructed on the tested wafer, and engineers can measure the electrical properties of the test chip to ensure the qualities of the tested wafer.

The test chip can be a mini array test element group (TEG). However, for a conventional mini array TEG with container, it is difficult to test whether current leakage in two directions vertical to each other appears.

SUMMARY

In view of this, the present disclosure provides a test array structure, a wafer structure with the test array structure and a wafer testing method.

One aspect of the present disclosure is related to a test array structure. A test array structure includes a substrate, a first cell and a second cell, a first bit-line ring and a second bit-line ring, a first word-line, a second word-line, a third word-line and a fourth word-line. Each of the first and second cells has a first drain region, a first gate region, a source region, a second gate region and a second drain region connected together in sequence. The first bit-line ring and the second bit-line ring are located on the substrate. The first drain region and the first gate region of the first cell are located within the first bit-line ring. The second drain region and the second gate region of the first cell are located between the first and second bit-line rings. The first drain region and the first gate region of the second cell is located within the second bit-line ring The second drain region and the second gate region of the second cell is located beyond the first and second bit-line rings. The first, second, third and fourth word-lines are located over the first and second bit-line rings. The second drain region of the first cell and the first drain region of the second cell are located between the second and third word-lines.

In one or more embodiments, each of the first and second bit-line rings is close oval rings extending along a first direction.

In some embodiments, the first, second, third and fourth word-lines are parallel to each other and extend along a second direction intersecting the first direction.

In one or more embodiments, the test array structure further includes a plurality of capacitors. Each of the first and second drain regions is connected to corresponding one of the capacitors.

In one or more embodiments, the source region of the first cell is located under and connected to the first bit-line ring, and the source region of the second cell is located under and connected to the second bit-line ring.

In one or more embodiments, the first gate region of the first cell is located under and connected to the first word-line. The second gate region of the first cell is located under and connected to the second word-line. The first gate region of the second cell is located under and connected to the third word-line, and the second gate region of the second cell is located under and connected to the fourth word-line.

In one or more embodiments, the test array structure further includes a third cell. The third cell has a first drain region, a first gate region, a source region, a second gate region and a second drain region connected together in sequence. The first drain region and the first gate region of the third cell are located between the first and second bit-line ring. The second drain region and the second gate region of the third cell are located within the second bit-line ring.

In one or more embodiments, each of the first and second cells has two channel regions located under the corresponding first and second gate regions respectively.

One aspect of the present disclosure is related to a wafer structure. A wafer structure includes a plurality of chips. At least one of the chips has the test array structure mentioned above.

One aspect of the present disclosure is related to a wafer testing method. A wafer testing method for test element group includes following operations. Provide a wafer structure having the test array structure mentioned above. Apply an "on" voltage to the first bit-line ring and an "off" voltage to the second bit-line ring. Apply "on" voltages to the first, second, third and fourth word-line and measure a first leakage amplitude which is a current between the second drain region of the first cell and the first drain region of the second cell. Apply "off" voltages to the first and the third word-line, apply "on" voltages to the second and fourth word-line, and measure a second leakage amplitude which is a current between the second drain region of the first cell to drain region of the second cell. Compare the first leakage amplitude and the second leakage amplitude to determine whether a leakage of the first and second cells appears. Mark the wafer structure as a failure wafer if the leakage of the first and second cells appears.

In one or more embodiment, the test array structure further includes a third cell having a first drain region, a first gate region, a source region, a second gate region and a second drain region connected together in sequence. The first drain region and the first gate region of the third cell is located between the first and second bit-line ring, the second drain region and the second gate region of the third cell is located within the second bit-line ring. The wafer testing method further includes following operations. Measure a third leakage amplitude which is a current between the second drain region of the first cell and the first drain region of the third cell. Determine whether a leakage of the first and third cells appears according to the third leakage amplitude. Mark the wafer structure is a failure wafer if the leakage of the first and third cells appears.

In summary, the test array structure can include two horizontal bit-line rings and vertical word-lines, and a current leakage test for two direction vertical to each other can be performed. The test array structure can be provided on a wafer structure to be tested, and the quality of the tested wafer structure can be ensured.

The above description is only used to explain the problems to be solved by the present disclosure, the technical means for solving the problems and the produced effects.

The specific details of the present disclosure are described in detail in the following embodiments and related drawings.

BRIEF DESCRIPTION OF THE DRAWINGS

The drawings disclose one or more embodiments of the present disclosure and, together with the explanation in the description, serve to explain the principles of the present disclosure. Wherever possible, the same reference numbers will be used throughout the drawings to refer to the same or like elements in the embodiments. These drawings include.

DETAILED DESCRIPTION

The following embodiments are disclosed with accompanying diagrams for a detailed description. For illustration clarity, many details are explained in the following description. However, it should be understood that these details do not limit the present disclosure. That is, these details are not necessary in parts of embodiments of the present disclosure. Furthermore, for simplifying the drawings, some of the conventional structures and elements are shown with schematic illustrations. Also, the same labels may be regarded as the corresponding components in the different drawings unless otherwise indicated. The drawings are drawn to clearly illustrate the connection between the various components in the embodiments, and are not intended to depict the actual sizes of the components.

In addition, terms used in the specification and the claims generally have their usual meaning as used in the field, in the context of the disclosure and in the context of the particular content unless particularly specified otherwise. Some terms used to describe the disclosure are discussed below or elsewhere in the specification to provide additional guidance related to the description of the disclosure to those in the art.

The phrases "first," "second," etc., are solely used to separate the descriptions of elements or operations with the same technical terms, and are not intended to convey a meaning of order or to limit the disclosure.

Additionally, the phrases "comprising," "includes," "provided," and the like, are all open-ended terms, i.e., meaning including but not limited to.

Further, as used herein, "a" and "the" can generally refer to one or more unless the context particularly specifies otherwise. It will be further understood that the phrases "comprising," "includes," "provided," and the like used herein indicate the stated characterization, region, integer, step, operation, element and/or component, and does not exclude additional one or more other characterizations, regions, integers, steps, operations, elements, components and/or groups thereof.

Figure 1A:
FIG. 1A illustrates a top view of a test array structure according to one embodiment of the present disclosure.

Reference is made to FIG. 1A. FIG. 1A illustrates a top view of a test array structure 100 according to one embodiment of the present disclosure. As shown in figure, the test array structure includes a substrate 110, bit-line rings BLR1, BLR2 and BLR3, word-lines WL1, WL2, WL3, WL4, WL5, WL6 and WL7, and a plurality of cells. In this embodiment, the cells formed on the substrate 110 include cells 120, 140 and 160, and the drain terminals of the cells 120, 140 and 160 are located on the substrate 110. The word-lines WL1, WL2, WL3, WL4, WL5, WL6 and WL7 are arranged in sequence.

In this embodiment, each of the cells 120, 140 and 160 is consisting of two metal-oxide-semiconductor field-effect transistors (MOSFETs). Each of cells 120, 140 and 160 has two drain regions, two gate regions, a common source region and channel regions formed within the substrate 110. Isolation areas can be introduced between the cells to electrically isolation the cell. The circles on the substrate 110 shown in FIG. 1A are the drain terminals of the cells 120, 140 and 160. The drain terminal respectively connected to the drain regions of the cells 120, 140 and 160. For details, please refer to the following discussion.

As shown in FIG. 1A, the bit-line rings BLR1, BLR2 and BLR3 are close oval rings extending along an x-axis direction. The bit-line rings BLR1, BLR2 and BLR3 can be made by conductive material and connected to the source of the cells 120, 140 and 120. In FIG. 1A, parts of the drain terminals of the cells (e.g., cells 120, 140 and 160) are located inside the bit-line rings BLR1, BLR2 and BLR3, parts of the drain terminals of the cells are located between the bit-line rings BLR1, BLR2 and BLR3.

The word-lines WL1-WL7 are formed over the bit-line rings BLR1, BLR2 and BLR3. The word-lines WL1-WL7 are not electrically connected to the bit-line rings BLR1, BLR2 and BLR3. In this embodiment, the word-lines WL1-WL7 extend along the y-axis direction, which perpendicular to the x-axis direction where the bit-line rings BLR1, BLR2 and BLR3 extend along. The word-lines WL1-WL7 are used to connected the gate regions of the cells (e.g., cells 120, 140 and 160), and the MOSFET within the cells can be control through the word-lines WL1-WL7. In some embodiments, the extending direction of the bit-line rings intersects the extending direction of the word-lines.

In FIG. 1A, the cells (e.g., cells 120, 140 and 160) are arranged to form a cell array. The bit-line rings BLR1, BLR2 and BLR3 enclose part of the drain terminals. The word-lines WL1-WL7 further formed on the bit-line rings BLR1, BLR2 and BLR3, and each of the drain terminals are located between the bit-line rings (e.g. within one of the bit-line rings BLR1-BLR3 or between two of the bit-line rings BLR1-BLR3) and between the word-lines WL1-WL7. The bit-line rings BLR1-BLR3 and the word-lines WL1-WL7 form a plurality of rectangle regions, and the drain terminals of the cells (e.g. cells 120, 140 and 160) are respectively located in the rectangle regions. The drain terminals do not contact the bit-line rings BLR1-BLR3 and the word-lines WL1-WL7. In some embodiments, the drain terminals can be capacitors, and each cells can be memory cells.

Figure 1B:
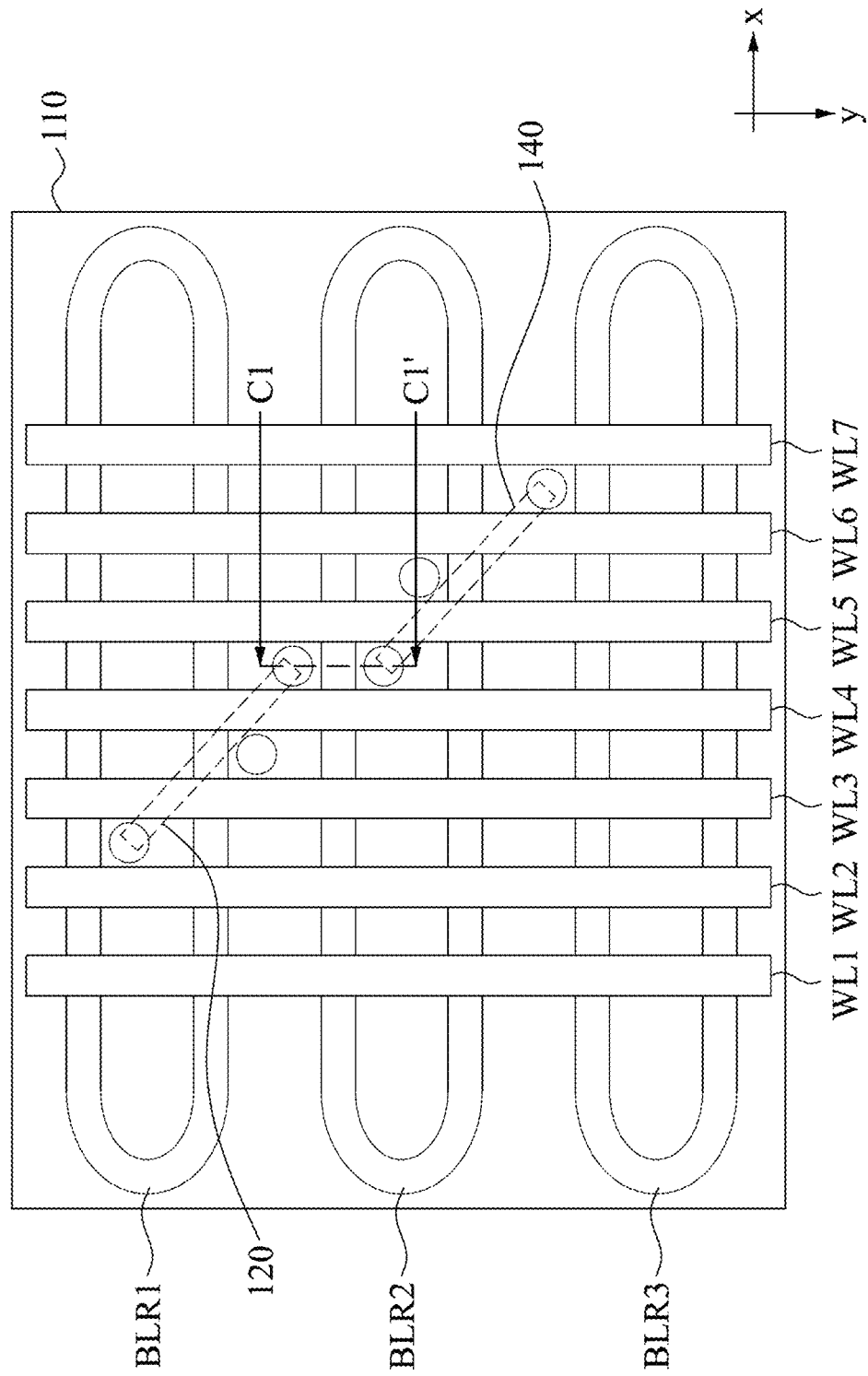
FIGS. 1B and 1C illustrate simplified top views of a test array structure according to one embodiment of the present disclosure.
Figure 1C:
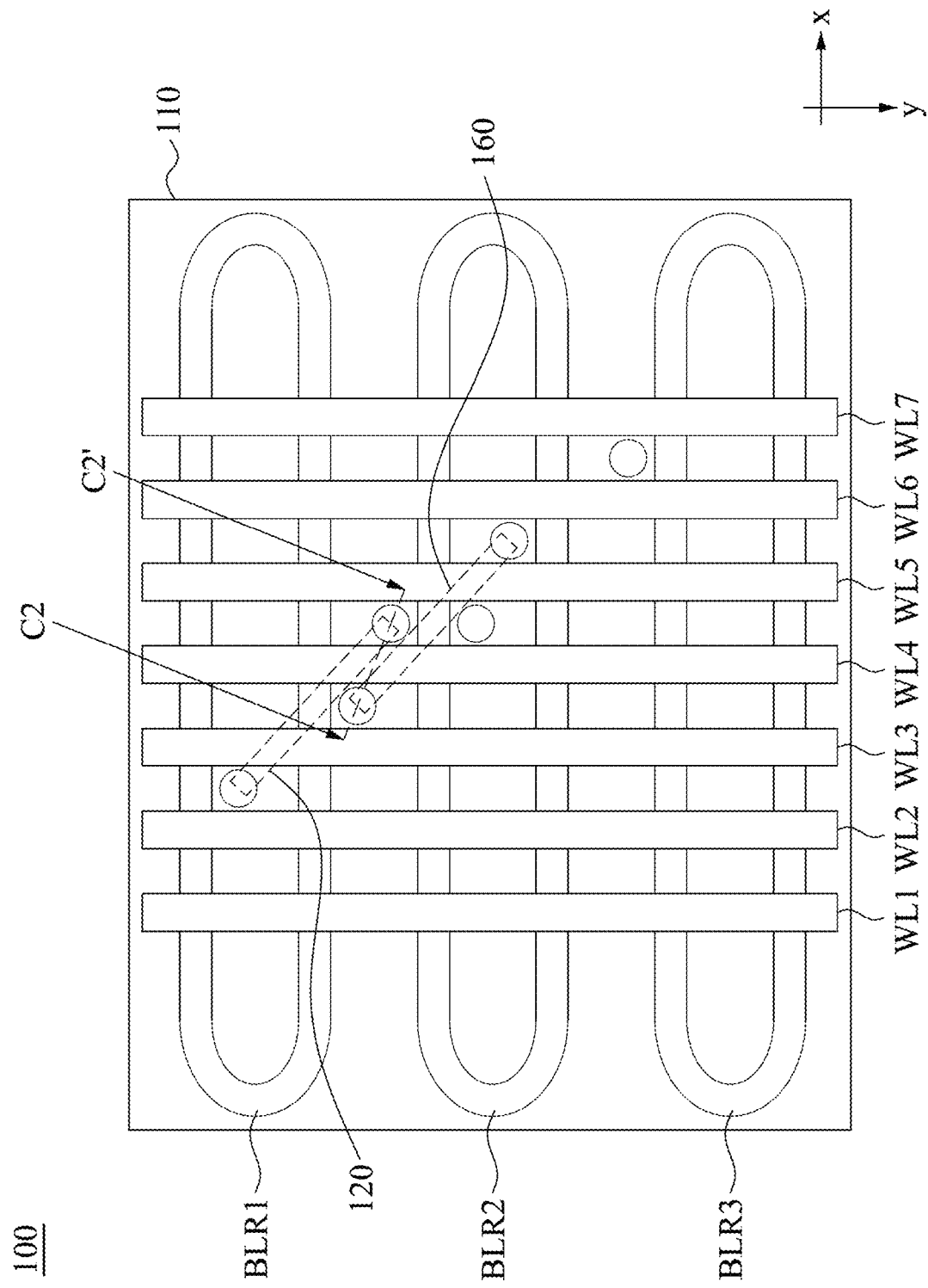

For the sake of simplicity, please refer to FIGS. 1B and 1C. FIGS. 1B and 1C illustrate simplified top views of a test array structure 100 according to one embodiment of the present disclosure. Only three cells 120, 140 and 160 are performed on the substrate 110.

In FIG. 1B, the cells 120 and 140 are two adjacent cells. In the test array structure 100, the current leakage from the first cell 120 to the second cell 140 can be measured.

Figure 2:
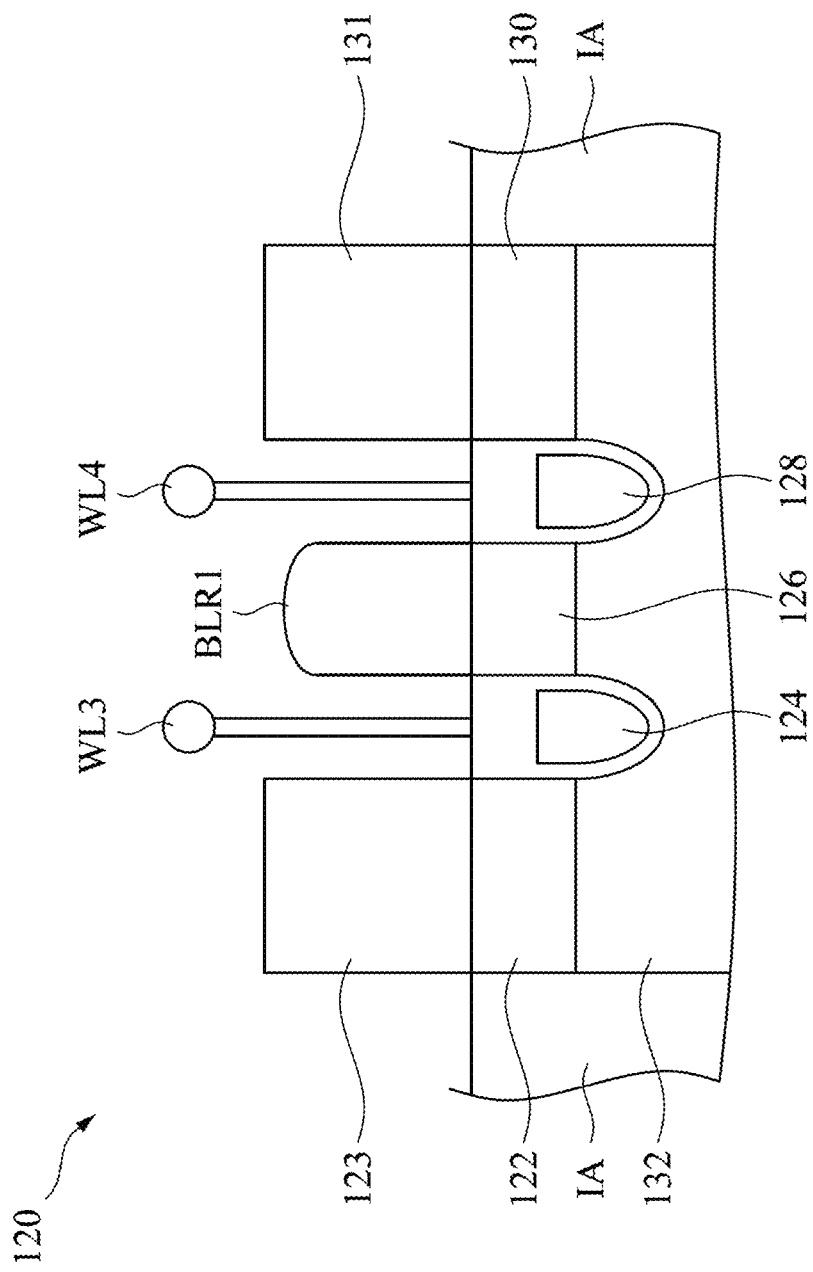
FIGS. 2, 3 and 4 respectively illustrate cross-section views of cell in the test array structure of FIG. 1A.

FIG. 2 illustrates a cross-section view of cell 120 in the test array structure in FIG. 1A. The first cell 120 includes a drain region 122, a gate region 124, a source region 126, a gate region 128 and a drain region 130. Each of the gate regions 124 and 128 is formed by a semiconductor region and an insulator enclosing the semiconductor region. The drain region 122, the gate region 124, the source region 126, the gate region 128 and the drain region 130 are connected together in sequence. The isolation areas IA is formed at two side of the first cell 120 to electrically isolate the first cell 120 and other cells on substrate 110.

The drain region 122, the gate region 124 and the source region 126 form a MOSFET, the drain region 130, the gate region 128 and the source region 126 form another MOSFET, and the two MOSFETs share a common source region 126. In a specific case, each cell can include two p-MOSFETs. In some embodiments, each cell can include two n-MOSFETs instead.

In FIG. 2, the first cell 120 further includes drain terminals 123 and 131. The drain terminals 123 and 131 are respectively connected to the drain regions 122 and 130. The drain terminals 123 and 131 can be conductive material. In some embodiments, the drain terminals 123 and 131 can include capacitors, and the first cell 120 can be a DRAM memory cell composed of two 1T1C memory units. Similarly, in some embodiment, the second cell 140 and the third cell 160 can be memory cells. In other words, the cells 120, 140 and 160 can be formed by a DRAM memory manufacturing process.

As shown in FIG. 2, the bit-line ring BLR1 is located on the source region 126 of the first cell 120. The bit-line ring BLR1 is electrically connected to the source region 126. The two immediately-adjacent word-lines WL3 and WL4 are respectively connected to the gate regions 124 and 126. Reference is made by FIGS. 1A and 2, the extending direction of the bit-line ring BLR1 and the extending direction of the word-lines WL3 and WL4 are perpendicular to each other. The bit-line ring BLR1 intersects the word-lines WL3 and WL4.

Figure 3:
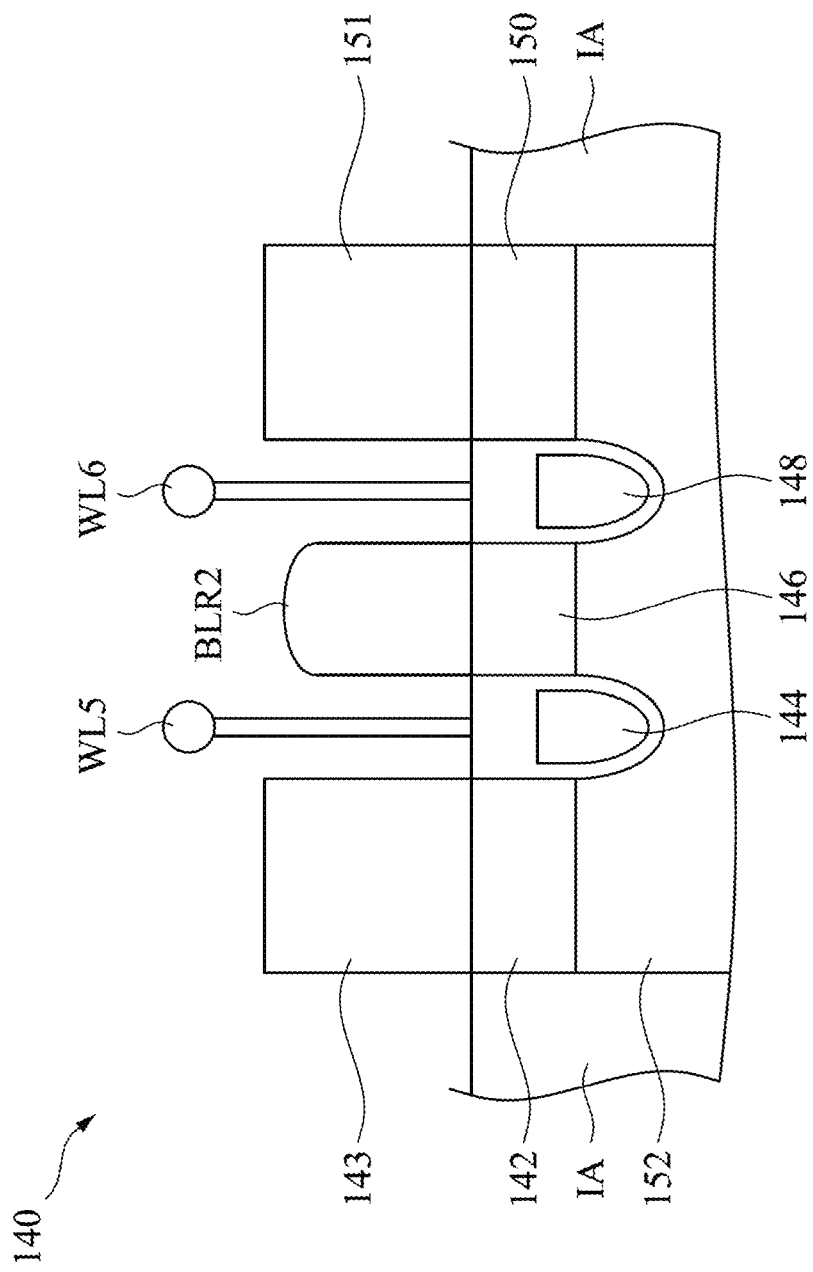

Similarly, please refer to FIG. 3. FIG. 3 illustrates a cross-section view of cell 140 in the test array structure in FIG. 1A. The second cell 140 includes a drain region 142, a gate region 144, a source region 146, a gate region 148 and a drain region 150. Each of the gate regions 144 and 148 is formed by a semiconductor region and an insulator enclosing the semiconductor region. The drain region 142, the gate region 144, the source region 146, the gate region 148 and the drain region 150 are connected together in sequence. The channel region 152 is located under the gate regions 144 and 148.

In this embodiment, the bit-line ring BLR2 is electrically connected to the source region 146. The word-line WL5 is electrically connected to the gate region 144 to control a transistor formed by the drain region 142, the gate region 144 and the source region 146, and the word-line WL6 is electrically connected to the gate region 148 to control a transistor formed by the drain region 150, the gate region 148 and the source region 146. The drain terminals 143 and 151 are respectively connected to the drain regions 142 and 150.

Figure 4:
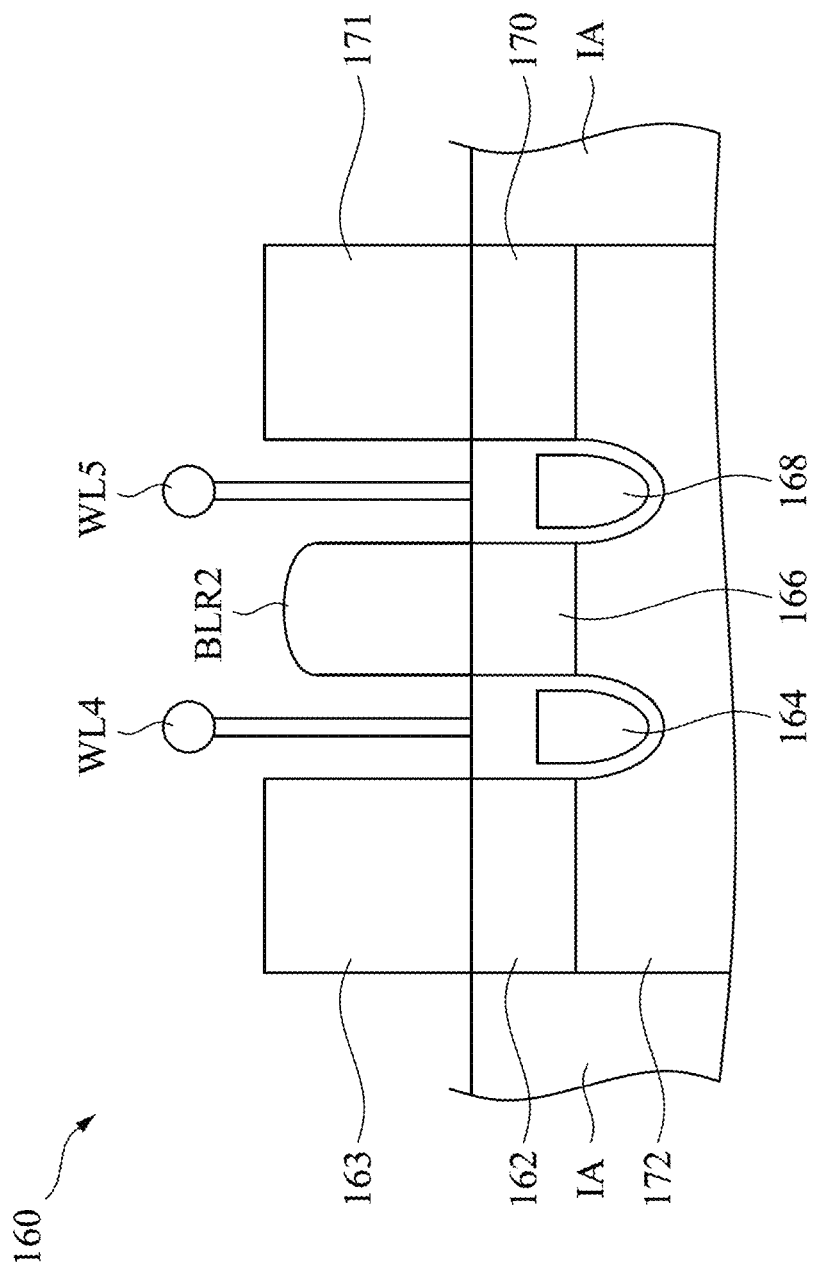

FIG. 4 illustrates a cross-section view of cell 160 in the test array structure in FIG. 1A. The third cell 160 includes a drain region 162, a gate region 164, a source region 166, a gate region 168 and a drain region 170. Each of the gate regions 164 and 168 is formed by a semiconductor region and an insulator enclosing the semiconductor region. The drain region 162, the gate region 164, the source region 166, the gate region 168 and the drain region 170 are connected together in sequence. The channel region 172 is located under the gate regions 164 and 168.

As shown in FIG. 4, the bit-line ring BLR2 is electrically connected to the source region 166. The word-line WL4 is electrically connected to the gate region 164 to control a transistor formed by the drain region 162, the gate region 164 and the source region 166, and the word-line WL5 is electrically connected to the gate region 168 to control a transistor formed by the drain region 170, the gate region 168 and the source region 166. The drain terminals 163 and 171 are respectively connected to the drain regions 162 and 170.

Figure 5:
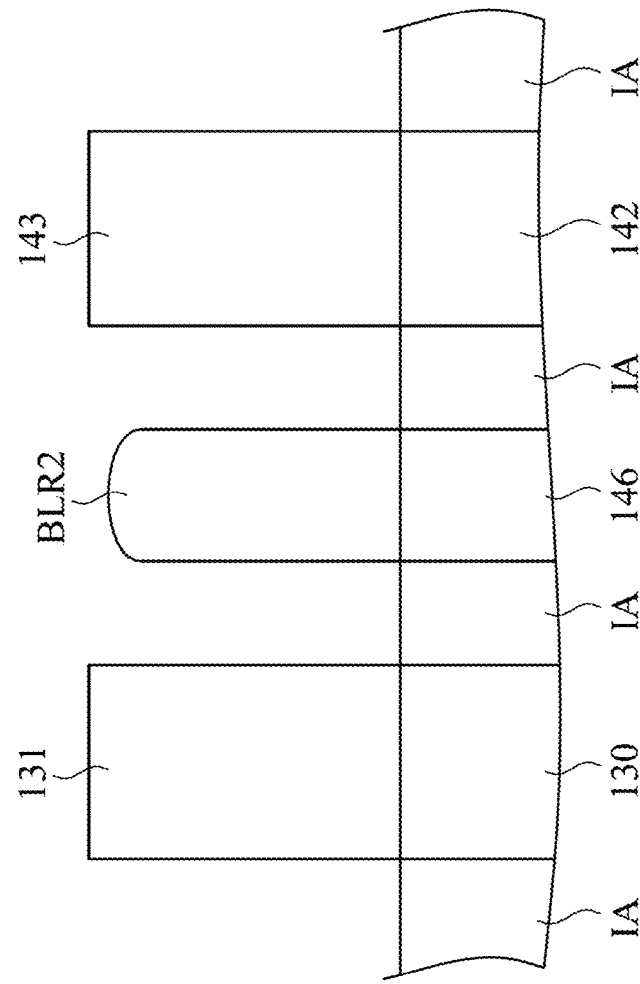
FIG. 5 illustrates a cross-section view along line C1-C1' in FIG. 1B.

Reference is made by FIG. 1B and FIG. 5. FIG. 5 illustrates a cross-section view along line C1-C1' in FIG. 1B. A specific structure between the first cell 120 and the second cell 140 is illustrated. In other words, FIG. 5 illustrated the structure between the two immediately-adjacent word-lines WL4 and WL5. The word-line WL5 is one of two closest word-lines form the word-line WL4. As shown in FIG. 5, the drain region 130 of the first cell 120 and the drain region 142 of the second cell 140 are located between the two immediately-adjacent word-lines WL4 and WL5. A portion of the bit-line ring BLR2 is located between the drain terminals 131 and 143. The drain terminals 131 and 143 are respectively connected to the drain regions 130 and 142.

An isolation area IA is located between the drain region 130 and the source region 146 under the bit-line ring BLR2, and another isolation area 143 is located between the source region 146 and the drain region 142. The isolation areas IA are used to electrically isolate the first cell 120 and the second cell 140. In some embodiments, the isolation area IA can be shallow trench isolations (STI).

In this embodiment, two isolation areas IA further surround the drain regions 130 and 142. Specifically, isolation areas IA are located around the cells (e.g., first cell 120, second cell 140 and third cell 160), and cells are electrically isolated with each other.

In general, there is no current between the first cell 120 and the second cell 140 since the isolation area IA. The test array structure 100 can easily measure the current leakage between the first cell 120 and the second cell if the electrical isolation function of the isolation areas IA is not performed with unexpected reasons. In other words, refer to FIG. 1B and FIG. 5, the current leakage along the y-axis direction can be measured. Therefore, the test array structure 100 can be formed on a semiconductor substrate and used for test element group. Please refer to following discussions for details.

Figure 6:
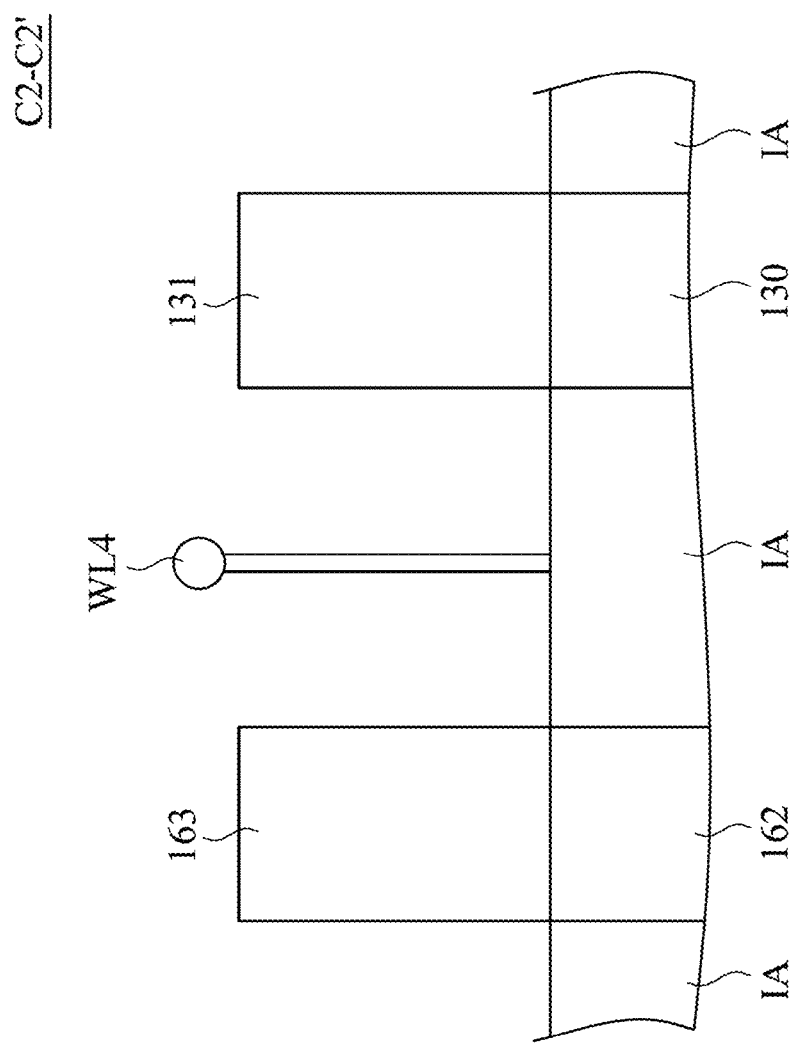
FIG. 6 illustrates a cross-section view along line C2-C2' in FIG. 1C.

Reference is made by FIG. 1C and FIG. 6. FIG. 6 illustrates a cross-section view along line C2-C2' in FIG. 1C. As shown in FIG. 6, the drain region 162 of the third cell 160 and drain region 130 of the second cell 120 are provided. The drain terminals 163 and 131 are respectively connected to the drain regions 162 and 130. The isolation areas IA are located between or around the drain regions 162 and 130. Therefore, the drain region 162 and 130 are electrical isolated by the isolation areas IA, thereby the third cell 160 is electrically isolated with the first cell 120.

In FIG. 6, the word-line WL4 is connected to the isolation area IA located between the drain regions 162 and 130. In general, the word-line WL4 is connected to a gate region of one of the cells to control a transistor along x-axis direction. In this case, although a gate region is not formed between the drain regions 162 and 130, and the word-line WL4 is still formed to connected a region between the drain regions 162 and 130 for the convenience of a manufacturing process.

Specifically, the test array structure 100 can be formed based on a DRAM memory array. In this case, each of the bit-line rings (e.g., bit-line ring BLR1, BLR2 or BLR3) can be regard as two adjacent bit-lines, and one end of one of the two adjacent bit-lines is connected to one end of another bit-lines to form a bit-line ring. Therefore, the two adjacent bit-lines forming the bit-line ring can have the same voltage.

In some embodiments, the two adjacent bit-lines can respectively have two terminals connected to each other and applied to the same voltage. However, from a modern manufacturing process point of view, it is difficult to provide two extra terminals for two formed bit-lines because of the element size. A size of a semiconductor element is very small. In this embodiment, each of the bit-line rings (e.g., bit-line rings BLR1-BLR3) is one-piece conductive ring formed in one process. In other word, for example, each bit-line ring is an oval close ring formed on the substrate 110 and made by conductive material in one process. In this case, no extra terminal or contact for bit-lines is need. In some embodiments, the test array structure 100 can be formed in an original manufacturing process of a DRAM memory array.

In general, there is no current between the first cell 120 and the third cell 160 since the isolation area IA. In this case, the test array structure 100 can easily measure the current leakage between the drain region 130 of the first cell 120 and drain region 162 of the third cell 160 if the electrical isolation function of the isolation areas IA is not performed with unexpected reasons. In other words, refer to FIG. 1C and FIG. 6, the current leakage along the x-axis direction can be measured. Please refer to following discussions for details.

Therefore, the test array structure 100 can be used to detect the cell-to-cell leakage in two directions, and the test array structure 100 can be formed on a semiconductor substrate and used for wafer testing (e.g., test element group).

Figure 7:
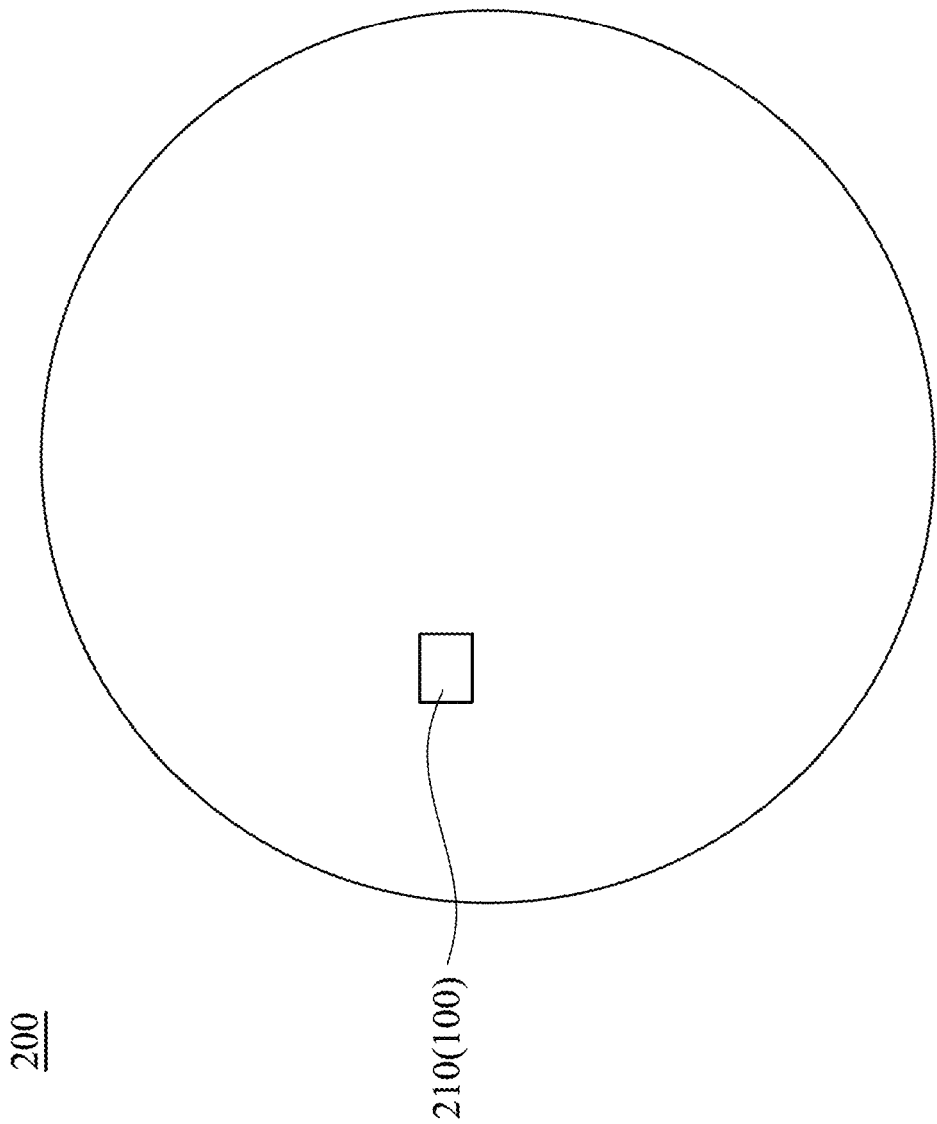
FIG. 7 illustrates a schematic top view of a wafer structure according to one embodiment of the present disclosure.

FIG. 7 illustrates a schematic top view of a wafer structure 200 according to one embodiment of the present disclosure. The wafer structure 200 has a plurality of chips, and at least one chip has a test array structure mentioned above. For the purpose of the description, only a chip 210 on the wafer structure 200 is shown in FIG. 7. The chip 210 includes the test array structure 100 is provided on the wafer structure 200. Therefore, the test array structure 100 can be used for test element group (TEG) test to determine whether the wafer structure is a failure wafer.

Figure 8:
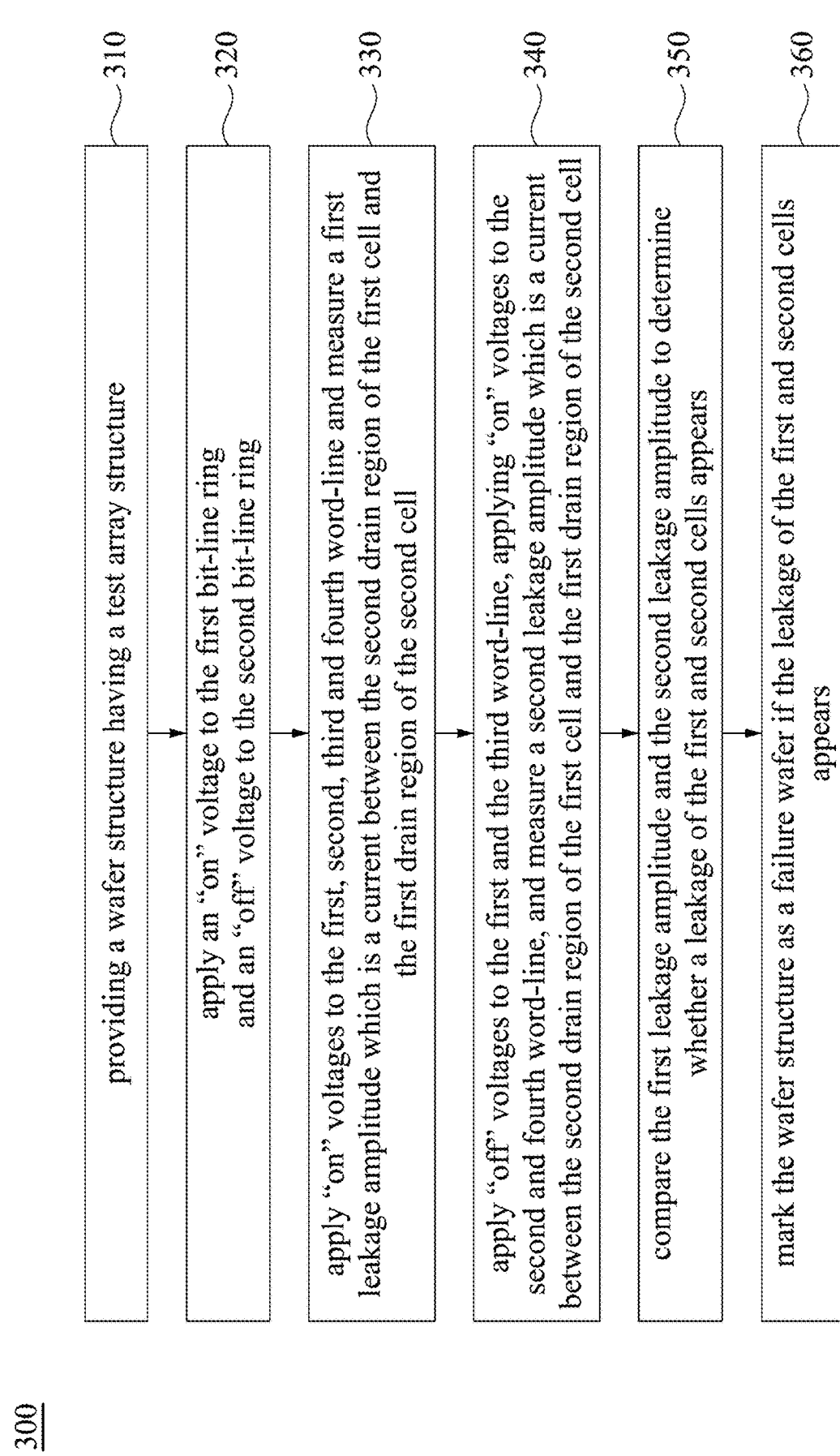
FIG. 8 illustrates a flow chart of a wafer testing method according to one embodiment of the present disclosure.

FIG. 8 illustrates a flow chart of a wafer testing method 300 according to one embodiment of the present disclosure. The wafer testing method 300 is used to determine whether a wafer structure is a failure through measuring electrical properties of a test chip. In the present disclosure, the test array structure can be formed on the test chip to perform a test element group (TEG) test for a wafer structure. The wafer testing method 300 for test element group includes operations 310-360.

In operation 310, provide a wafer structure 200 having a test array structure 100 as illustrated in FIG. 7.

As mentioned above, the test array structure 100 has a substrate (e.g., substrate 110), cells (e.g., first cell 120, second cell 140 and third cell 160), bit-lines rings (e.g., bit-line ring BLR1-BLR3) and word-lines (e.g., word-lines WL1-WL7). Reference is made by FIGS. 2-4, the bit-line ring BLR1 is connected to the source region 126 of the first cell 120, the bit-line ring BLR2 is connected the source region 146 of the second cell 140 and the source region 166 of the third cell 160. The word-line WL3 is connected to the gate region 124 of the first cell 120. The word-line WL4 is connected to the gate region 128 of the first cell 120 and the gate region 164 of the third cell 160. The word-line WL5 is connected to the gate region 144 of the second cell 140 and the gate region 168 of the third cell 160. The word-line WL7 is connected to the gate region 148 of the first cell 140.

In this case, each cell includes two p-MOSFETs. Applying "on" voltage for a source regions means providing a driving voltage. In addition, applying a voltage higher than threshold of the p-MOSFET to a gate region can be regard as turning on a transistor, thereby applying a voltage higher than threshold of the p-MOSFET can be regarded as applying "on" voltage for a gate region.

Continued with operation 310, in operation 320, apply an "on" voltage to the first bit-line ring BLR1 and an "off" voltage to the second bit-line ring BLR2. In this case, provide a driving voltage for the first bit-line ring BLR1, and the second bit-line ring BLR2 has a floating voltage and is not connected to the driving voltage.

Further, in operation 330, apply "on" voltages to the first, second, third and fourth word-line and measuring a first leakage amplitude which is a current between the second drain region 130 of the first cell 120 to first drain region 142 of the second cell 140. For the test array structure 100, the first, second, third and fourth word-line can be respectively regarded as word-lines WL3-WL6.

In operation 340, apply "off" voltages to the first and the third word-line, applying "on" voltages to the second and fourth word-line, and measure a second leakage amplitude which is a current between the second drain region of the first cell to drain region of the second cell. For the test array structure 100, the first, second, third and fourth word-line can be respectively regarded as word-lines WL3-WL6, the word-line WL3 and WL5 have an "off" voltage and the word-lines WL4 and WL6 have an "on" voltage. The configuration in operation 330 can be regard as type-B of the test array structure 100.

For the type-A in operation 330 and type-B in operation 340 for the test array structure 100, refer to the following table:

| | TYPE | |
|---|---|---|
| voltage | type-A (operation 330) | type-B (operation 340) |
| BLR1 | ON | ON |
| BLR2 | OFF | OFF |
| WL3 | ON | OFF |
| WL4 | ON | ON |
| WL5 | ON | OFF |
| WL6 | ON | ON |
| Voltage of drain region 130 of the first cell 120 | HIGH | HIGH |
| Voltage of drain region 142 of the second cell 140 | LOW | FLOATIING |
| Voltage of drain region 162 of the third cell 160 | LOW | LOW |

For cell 120, please refer to FIG. 2 and the above table. For any of type-A or type-B, the bit-line ring BLR1 always has an "on" voltage, and the word-line WL4 always has an "on" voltage. Therefore, the source region 126 always has an "on" voltage, and a transistor formed by the source region 126, the gate region 128 and the drain region 130 is always turned on, and the drain region 130 of the first cell 120 always has a high voltage.

For the cell 140, please refer to FIG. 3 and the above table. For any of type-A or type-B, the source region 146 always has an "off" voltage, and the source region 146 always has a floating voltage.

However, for type-A configuration of the test array structure 100 in operation 330, the word-line WL5 has an "on" voltage, a transistor formed by the source region 146, the gate region 144 and the drain 142 turns on, and the drain region 142 of the second cell 140 has a low voltage. In operation 330, since the drain region 130 of the first cell 120 has a high voltage and the drain region 142 of the second cell 140, a leakage current between the drain regions 130 and 142 can be exist if the isolation area IA between the drain regions 130 and 142 has unexpected detect causing short. The leakage current between the drain regions 130 and 142 can be regarded as the first leakage amplitude.

In operation 340, for type-B configuration of the test array structure 100 in operation 340, the word-line WL5 has an "off" voltage, a transistor formed by the source region 146, and the gate region 144 and the drain 142 does not turn on. There is not current flow in the transistor formed by the source region 146, the gate region 144 and the drain 142. Accordingly, for type-B configuration, there is no leakage current between the drain regions 130 and 142 even if the isolation area IA between the drain regions 130 and 142 has unexpected detect generally. Then, measure a second leakage amplitude which is a current between the second drain region 130 of the first cell 120 and the first drain region 142 of the second cell 140. In general, the second leakage amplitude is a value close to zero.

Continued with operations 330 and 340, in operation 350 compare the first leakage amplitude and the second leakage amplitude to determine whether a leakage of the first cell 120 and the second cell 140 appears. As mentioned above, the first leakage amplitude for type-A in operation 330 and the second leakage amplitude for type-B in operation 340 are quite different if the isolation area IA between the drain regions 130 and 142 has unexpected detect causing short.

Figure 9:
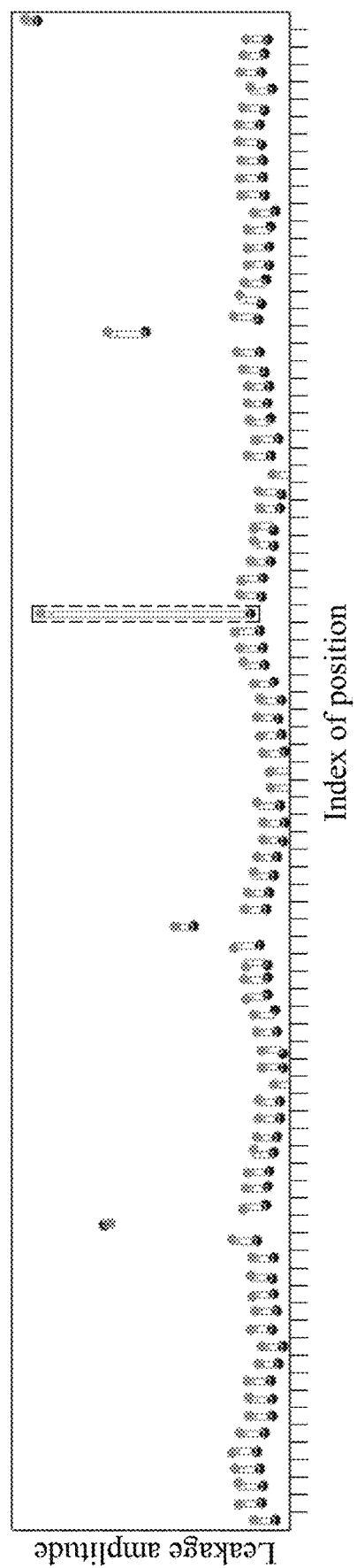
FIG. 9 illustrates a leakage amplitude comparison diagram in the test array structure.

FIG. 9 illustrates a leakage amplitude comparison diagram in the test array structure according to one embodiment of the present disclosure. The horizontal axis is the index of the positon corresponding to different current paths in the test array structure 100. The vertical axis is the leakage amplitude corresponding to different current paths. Each current path is corresponding to a current between the two adjacent drain regions.

FIG. 9 illustrates leakage amplitudes for type-A and type-B in different positon. As shown in FIG. 9, a quite difference corresponding to the first and second leakage amplitudes appears in the leakage amplitude comparison diagram. That is, it ensures that a current leakage of the first cell 120 and the second cell 140 appears. The leakage between the first cell 120 and the second cell 140 appears along the y-axis direction.

In operation 360, through the comparison shown in FIG. 9, it can be determined that the wafer structure 200 is a failure wafer if the current leakage of the first cell 120 and the second cell 140 appears. The wafer structure 200 can be marked as a failure wafer if the leakage of the first cell 120 and the second cell 140 appears, and then the failure wafer structure 200 can be removed.

Figure 10:
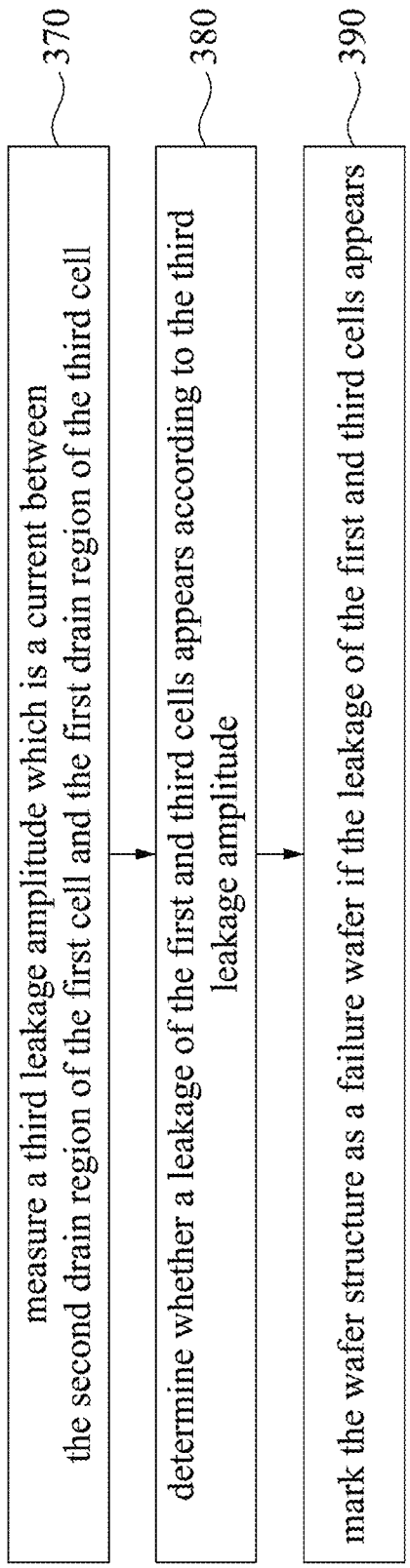
FIG. 10 illustrates continuous process for the wafer testing method shown in FIG. 8.

FIG. 10 illustrates continuous process for the wafer testing method 300 shown in FIG. 8. In this embodiment, through the operations 370-390, the current leakage along the x-axis direction can be measured.

In operation 370, measure a third leakage amplitude which is a current between the second drain region 130 of the first cell 120 and the first drain region 162 of the third cell 160.

Refer to the above table illustrating the voltage relation between the drain regions 130 and 162. Refer to the above table and FIG. 4. For any of type-A and type-B configuration, the bit-line ring BLR2 always has an "off" voltage, and the word-line WL4 always has an "on" voltage. The source region 166 has an "off" voltage. The gate region 164 has an "on" voltage. Therefore, a transistor formed by the source region 166, the gate region 164 and the drain region 162 always turns on, and the drain region 162 always has a low voltage. Third leakage amplitude which is a leakage current between the drain regions 162 and 130 can be measured if the isolation area IA between the drain regions 130 and 162 has unexpected detect causing short.

In operation 380, determine whether a leakage of the first cell 120 and the third cell 160 appears according to the third leakage amplitude. As shown in FIG. 6, if the isolation area IA located between the drain regions 162 and 130 has unexpected detect, the third leakage amplitude can be greater than a determined value, and the current leakage between the first cell 120 and the third cell 160 can be ensured. The leakage between the first cell 120 and the third cell 160 appears along the x-axis direction.

In operation 390, mark the wafer structure 200 as a failure wafer if the leakage of the first cell 120 and the third cell 160 appears. The failure wafer structure 200 can be removed after wafer testing.

In summary, a test array structure used for wafer testing is provided. The test array structure can be formed based on a DRAM memory array from an original DRAM manufacturing process. The test array structure can be used to measure the current leakage along two directions perpendicular to each other. The test array structure can be provided on a wafer structure to be tested, and the quality of the tested wafer structure can be ensured.

The foregoing has described features of several embodiments so that those skilled in the art may better understand the description in various aspects. It will be apparent to those skilled in the art that various modifications and variations can be made to the structure of the embodiments of the present disclosure without departing from the scope or spirit of the present disclosure. In view of the foregoing, it is intended that the present disclosure cover modifications and variations, provided they fall within the scope of the following claims.

What is claimed is:
1. A test array structure, comprising:
a substrate;
a first cell and a second cell, wherein each of the first and second cells has a first drain region, a first gate region, a source region, a second gate region and a second drain region connected together in sequence;
a first bit-line ring and a second bit-line ring located on the substrate, wherein the first drain region and the first gate region of the first cell are located within the first bit-line ring, the second drain region and the second gate region of the first cell is located between the first and second bit-line rings, the first drain region and the first gate region of the second cell is located within the second bit-line ring, and the second drain region and the second gate region of the second cell is located beyond the first and second bit-line rings; and a first word-line, a second word-line, a third word-line and a fourth word-line located over the first and second bit-line rings, wherein the second drain region of the first cell and the first drain region of the second cell is located between the second and third word-lines.

2. The test array structure of claim 1, wherein each of the first and second bit-line rings is a closed oval ring extending along a first direction.

3. The test array structure of claim 2, wherein the first, second, third and fourth word-lines are parallel to each other and extend along a second direction intersecting the first direction.

4. The test array structure of claim 1, further comprising:
a plurality of capacitors, wherein each of the first and second drain regions is connected to corresponding one of the capacitors.

5. The test array structure of claim 1, wherein the source region of the first cell is located under and connected to the first bit-line ring, and the source region of the second cell is located under and connected to the second bit-line ring.

6. The test array structure of claim 1, wherein the first gate region of the first cell is located under and connected to the first word-line, the second gate region of the first cell is located under and connected to the second word-line, the first gate region of the second cell is located under and connected to the third word-line, and the second gate region of the second cell is located under and connected to the fourth word-line.

7. The test array structure of claim 1, further comprising:
a third cell having a first drain region, a first gate region, a source region, a second gate region and a second drain region connected together in sequence, wherein the first drain region and the first gate region of the third cell is located between the first and second bit-line ring, the second drain region and the second gate region of the third cell is located within the second bit-line ring.

8. The test array structure of claim 1, wherein each of the first and second cells has two channel regions located under the corresponding first and second gate regions respectively.

9. A wafer structure comprising a plurality of chips, and at least one of the chips having the test array structure of claim 1.

10. A wafer testing method comprising:
providing a wafer structure having the test array structure of claim 1;
applying an "on" voltage to the first bit-line ring and an "off" voltage to the second bit-line ring;
applying "on" voltages to the first, second, third and fourth word-line and measuring a first leakage amplitude which is a current between the second drain region of the first cell to drain region of the second cell;
applying "off" voltages to the first and the third word-line, applying "on" voltages to the second and fourth word-line, and measuring a second leakage amplitude which is a current between the second drain region of the first cell and the first drain region of the second cell;
comparing the first leakage amplitude and the second leakage amplitude to determine whether a leakage of the first and second cells appears; and
marking the wafer structure as a failure wafer if the leakage of the first and second cells appears.

11. The wafer testing method of claim 10, wherein the test array structure further comprises a third cell having a first drain region, a first gate region, a source region, a second gate region and a second drain region connected together in sequence, wherein the first drain region and the first gate region of the third cell is located between the first and second bit-line ring, the second drain region and the second gate region of the third cell is located within the second bit-line ring, the wafer testing method further comprising:
measuring a third leakage amplitude which is a current between the second drain region of the first cell and the first drain region of the third cell;
determining whether a leakage of the first and third cells appears according to the third leakage amplitude; and
marking the wafer structure as a failure wafer if the leakage of the first and third cells appears.

* * * * *